US010953825B2

(12) United States Patent
Sanvito et al.

(10) Patent No.: US 10,953,825 B2
(45) Date of Patent: Mar. 23, 2021

(54) ELECTRICAL BUSBAR

(71) Applicant: VALEO SIEMENS EAUTOMOTIVE FRANCE SAS, Cergy (FR)

(72) Inventors: Guillaume Sanvito, Elancourt (FR); Pierre Smal, Sartrouville (FR)

(73) Assignee: VALEO SIEMENS EAUTOMOTIVE FRANCE SAS, Cergy (FR)

(*) Notice: Subject to any disclaimer, the term of this patent is extended or adjusted under 35 U.S.C. 154(b) by 0 days.

(21) Appl. No.: 15/775,991

(22) PCT Filed: Nov. 11, 2016

(86) PCT No.: PCT/EP2016/077421
§ 371 (c)(1),
(2) Date: May 14, 2018

(87) PCT Pub. No.: WO2017/081245
PCT Pub. Date: May 18, 2017

(65) Prior Publication Data
US 2018/0334116 A1 Nov. 22, 2018

(30) Foreign Application Priority Data

Nov. 13, 2015 (FR) ..................... 1560865

(51) Int. Cl.
*B60R 16/03* (2006.01)
*H05K 7/14* (2006.01)
(Continued)

(52) U.S. Cl.
CPC .............. *B60R 16/03* (2013.01); *H02G 5/00* (2013.01); *H02M 7/003* (2013.01);
(Continued)

(58) Field of Classification Search
None
See application file for complete search history.

(56) References Cited

U.S. PATENT DOCUMENTS 4,677,540 A 6/1987 Fujioka
5,579,217 A 11/1996 Deam et al.
(Continued)

FOREIGN PATENT DOCUMENTS

DE 102011080912 A1 2/2013
EP 2328392 A2 6/2011
(Continued)

OTHER PUBLICATIONS

International Search Report and Written Opinion of the Search Authority for PCT/EP2016/077421.
French Office Preliminary Search Report.

*Primary Examiner* — Xanthia C Cunningham
(74) *Attorney, Agent, or Firm* — Joseph G. Chu; Jeremy I. Maynard; JCIP

(57) ABSTRACT

The invention relates to an electrical busbar (400) intended for electrically connecting an electrical component, said electrical busbar (400) including: at least one electrically conductive part (410); a coating (420) made of electrically insulating material covering said part (410) at least in a main plane of the busbar (400), the electrically conductive part (410) including: a first end forming an electrical connection terminal; a planar portion extending so as to follow said main plane; and an electrically conductive cylinder (414) which extends away from a first surface of the planar portion in a transverse direction relative to the main plane, the inner wall of the cylinder extending away from an opening located in the planar portion so as to receive a rod in order to rest the distal end (414a) of the cylinder (414) on a terminal of the electrical component.

9 Claims, 13 Drawing Sheets

(51) Int. Cl.
  *H02G 5/00*   (2006.01)
  *H02M 7/00*   (2006.01)
  *H05K 5/00*   (2006.01)
  *H05K 5/02*   (2006.01)
  *G01R 15/20*  (2006.01)

(52) U.S. Cl.
  CPC ......... *H05K 5/0017* (2013.01); *H05K 5/0247* (2013.01); *H05K 7/1432* (2013.01); *G01R 15/202* (2013.01)

(56) References Cited

U.S. PATENT DOCUMENTS

| | | | | |
|---|---|---|---|---|
| 5,812,387 | A * | 9/1998 | Lu | H02M 3/00 361/790 |
| 6,031,751 | A * | 2/2000 | Janko | F28F 13/00 165/104.33 |
| 6,433,281 | B1 * | 8/2002 | Miyajima | H02G 3/16 174/149 B |
| 6,743,027 | B1 * | 6/2004 | Kowtun | H01R 13/6658 307/10.1 |
| 7,002,789 | B1 * | 2/2006 | Georgopoulos | H01G 2/04 29/25.41 |
| 7,819,681 | B1 * | 10/2010 | Rodrigues | H02G 5/007 174/88 B |
| 7,826,226 | B2 * | 11/2010 | Ishiyama | H01L 25/072 361/689 |
| 7,916,480 | B2 * | 3/2011 | Woody | H05K 7/209 361/699 |
| 8,502,484 | B2 * | 8/2013 | Hill | H01L 25/072 318/280 |
| 8,758,061 | B2 * | 6/2014 | Mische | H05K 1/0263 439/620.26 |
| 9,237,669 | B2 * | 1/2016 | Iwata | H02M 7/003 |
| 9,490,555 | B1 * | 11/2016 | Schmit | B60L 11/00 |
| 9,673,804 | B2 * | 6/2017 | Hubbers | H03K 17/16 |
| 9,735,524 | B1 * | 8/2017 | Rabl | H01R 4/30 |
| 2008/0268671 | A1 * | 10/2008 | Harris | H01H 85/046 439/76.2 |
| 2013/0308362 | A1 * | 11/2013 | Karlsson | H05K 7/209 363/141 |
| 2014/0083993 | A1 * | 3/2014 | Maier | F24C 7/087 219/446.1 |
| 2016/0286677 | A1 * | 9/2016 | Teusch | H05K 7/1432 |
| 2016/0309622 | A1 * | 10/2016 | Lei | H05K 7/20927 |
| 2017/0347484 | A1 * | 11/2017 | Lei | H05K 7/20927 |

FOREIGN PATENT DOCUMENTS

| | | |
|---|---|---|
| EP | 2736160 A1 | 5/2014 |
| EP | 2811576 A1 | 12/2014 |

* cited by examiner

ELECTRICAL BUSBAR

The present invention relates to an electrical busbar and an electrical equipment comprising an electrical busbar according to the invention, in particular for applications in the field of the automobile.

An inverter to operate an electrical machine embedded in a vehicle is known. The machine embedded in the vehicle allows in particular to drive the wheels of the vehicle. Such an inverter may comprise a power electronic module comprising components through which the energy supplying the electric machine flows; and an electronic control unit comprising components for operating the components of the electronic power unit.

For example, the publication of European patent application EP2736160 describes an inverter housed in a case and embedded in a vehicle. The document discloses an electrical busbar which provides the electrical connection between a power module of the inverter and an electrical connector mounted in a wall of the case. The electrical connector provides an electrical connection with the electrical machine operated by the inverter. The size of the case must be as small as possible to take the least space in the vehicle. An arrangement of components is being sought which improves the integration density of the inverter's components in the case.

To this end, the invention proposes an electrical busbar intended to electrically connect an electrical component, said busbar comprising:
- at least one electrically conductive part,
- a coating made of electrically insulating material covering said part at least in a main plane of the busbar,
- the electrically conductive part comprising:
- a first end forming an electrical connection terminal,
- a planar portion extending so as to follow said main plane;
- an electrically conductive cylinder which extends from a first side of the planar portion in a transverse direction relative to the main plane, the inner wall of the cylinder extending from an opening located in the planar portion so as to receive a rod in order to rest the distal end of the cylinder on a terminal of the electrical component.

Thus, when the terminal of the electrical component is located at a distance from the main plane of the electrical busbar, the electrically conductive cylinder allows to span this distance to allow electrical connection with the terminal of the electrical component. By receiving a rod for a resting of the distal end of the cylinder on the terminal of the electrical component, the cylinder provides an operational electrical contact between the busbar and the terminal of the component. An operational electrical contact means an electrical contact allowing the electrical busbar to exchange electrical energy with the component so that the component performs the function for which it is designed.

According to an embodiment, the coating comprises at least one protrusion extending transversely from the main plane on the same side as the electrically conductive cylinder, its distal end being configured to form a resting surface of the electrical busbar against a support.

According to an embodiment, the electrically conductive cylinder extends perpendicularly from the main plane and the protrusion extends at an angle greater than 90° with respect to the portion of the busbar extending in the main plane.

According to an embodiment, the flat portion of the electrically conductive part comprises a second opposite side to its first side and without electrically insulating material around the opening.

According to an embodiment, the busbar comprises a plurality of said electrically conductive part, in particular three.

The invention also relates to an electrical equipment intended to be embedded in a vehicle, comprising:
- a case,
- at least a first electrical component housed in said case,
- an electrical connector passing through an opening of the case so as to allow an exchange of energy between the first component and a component external to the electrical equipment,
- an electrical busbar according to the invention wherein the first end is connected to a terminal of the electrical connector, said busbar being positioned in such a way that the distal end of the electrically conductive cylinder is in contact with an electrical terminal of the first component,
- a rod received in the barrel of the electrically conductive cylinder so that the distal end of the electrically conductive cylinder rest on the electrical terminal of the first electrical component.

According to an embodiment, the distal end of the protrusion of the coating rest on a surface coming from the case.

According to an embodiment, the first electrical component is a power electronic module comprising switches intended for receiving a current exchanged with an electrical machine; the electrical equipment also comprising an electronic control unit comprising components intended to monitor the components of the electrical equipment; the electronic unit of control and the power electronic module being superimposed;

and wherein the electrically conductive cylinder passes through the electronic control unit via an opening to contact the electrical terminal of the power module.

According to an embodiment, the power electronic module is positioned on a wall of the case, the electronic control unit is supported by a wall located between the electronic control unit and the power electronic module, said wall having a hole intended for the passage of the electrically conductive cylinder.

According to an embodiment, the electronic control unit comprises a current sensor configured to measure a current flowing by means of the busbar, said current sensor comprising an opening surrounding the electrically conductive cylinder so as to measure said current, in particular by measuring a magnetic field induced by the passage of current.

The invention will be described in detail in the following description in conjunction with the accompanying drawings. It should be noted that these drawings have no other purpose than to illustrate the text of the description and do not constitute in any way a limitation of the scope of the invention.

Figure 1:
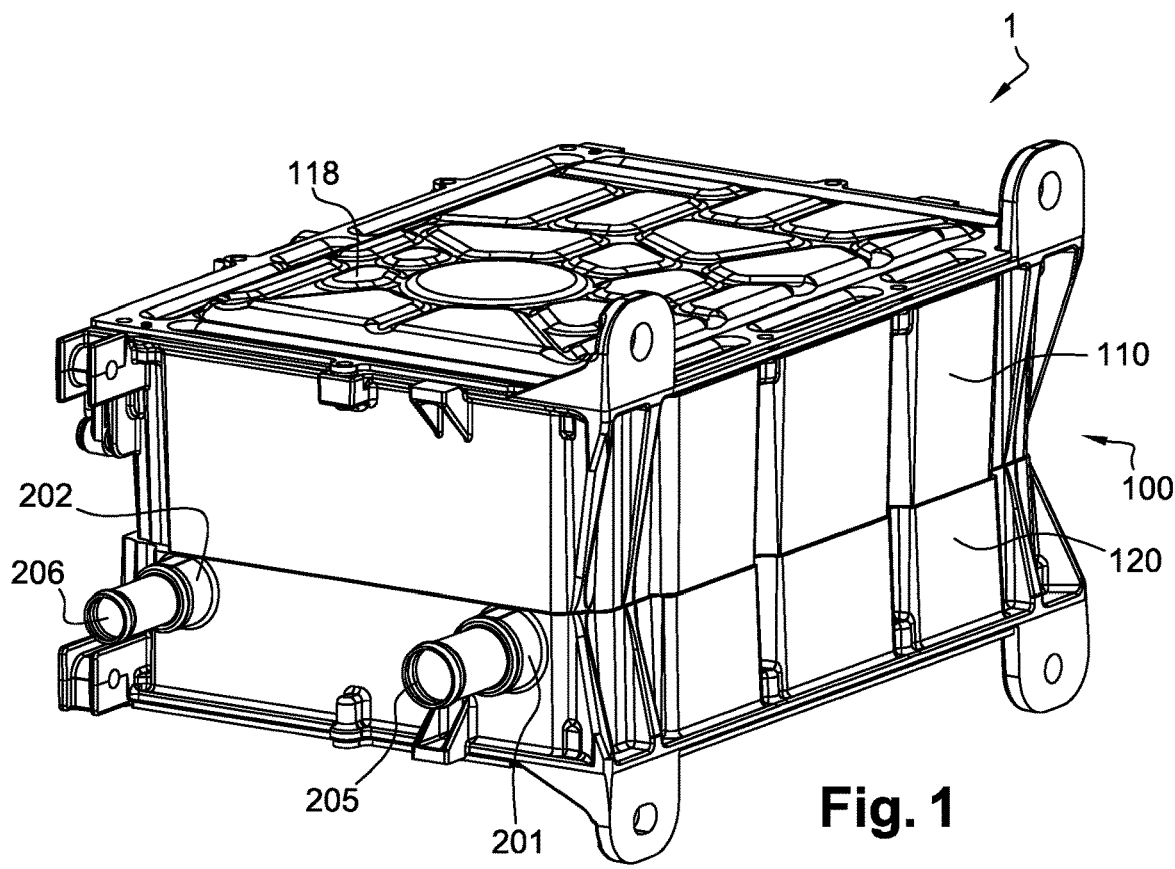
FIGS. 1 and 2 are perspective views of an example of electrical equipment 1 according to the invention.
Figure 2:
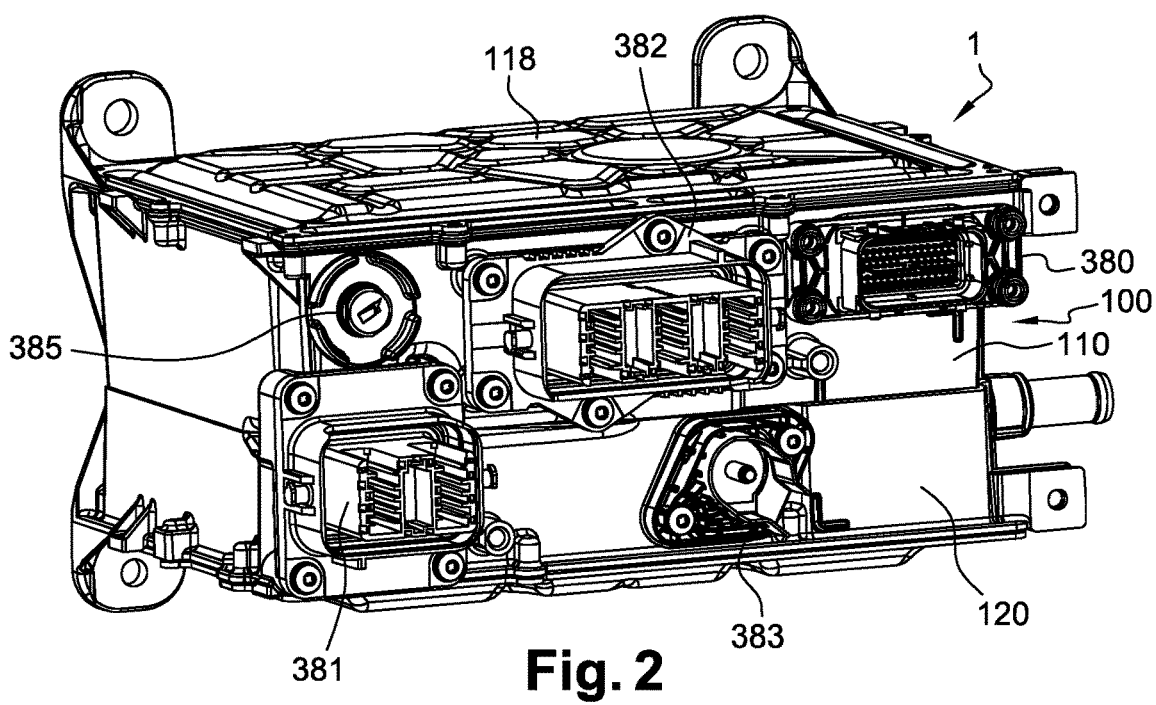
Figure 3:
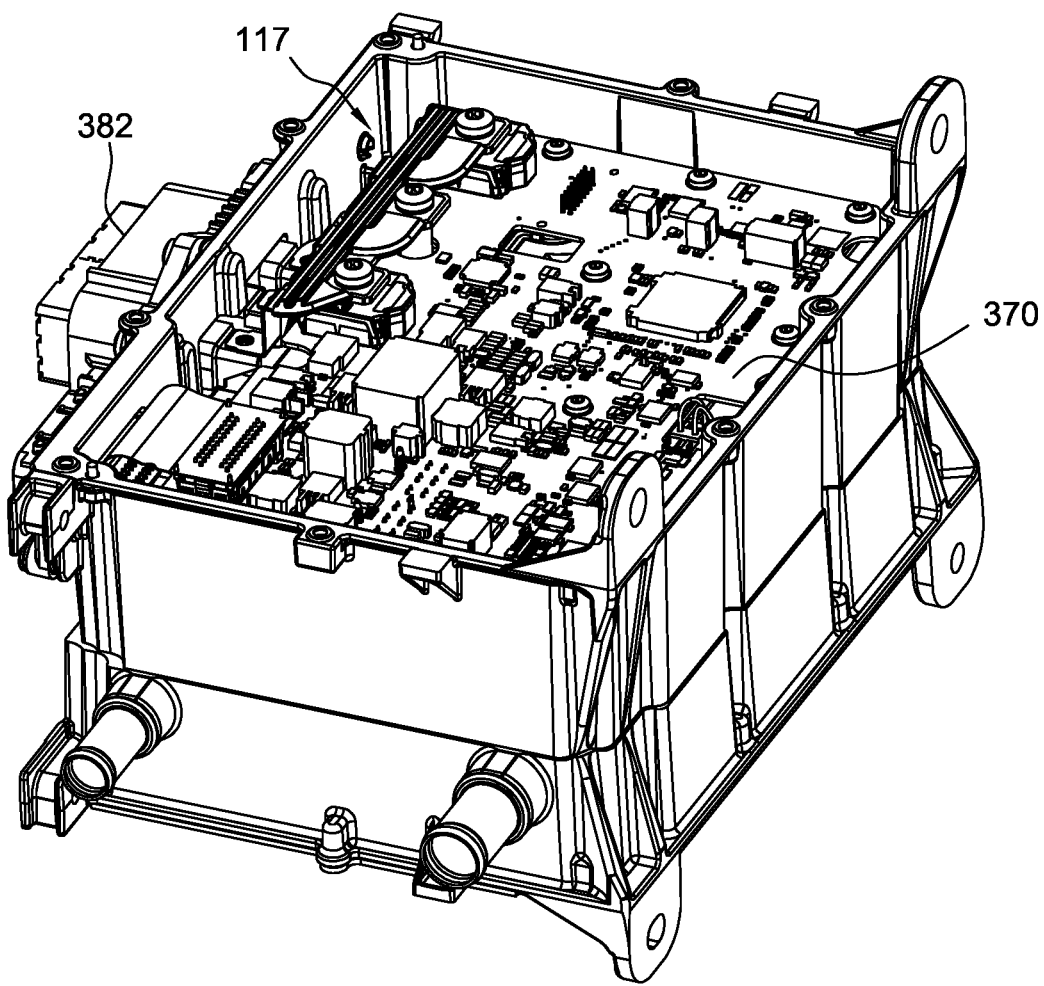
FIGS. 3 and 4 are respectively views of a first case and a second case of the electrical equipment when the covers are removed.

FIGS. 1 and 2 show perspective views of an example of electrical equipment 1 which comprises an electrical busbar according to the invention. The electrical equipment comprises an assembly 100 which houses the components of the electrical equipment 1. The electrical equipment 1 comprises in particular an inverter intended to power an electrical machine such as a rotary electrical machine, for example a machine intended to drive the wheels of a vehicle, from a first electrical grid of the vehicle. The electrical equipment notably comprises a DC/DC converter intended for converting a voltage between the first direct current electrical grid and a second direct current electrical grid of the vehicle. The inverter and the DC/DC converter can both be integrated into the electrical equipment 1, which makes it possible for a better integration density in the vehicle. For example, the first electrical grid is a high voltage grid and the second electrical grid is a low voltage grid. Typically, a low voltage grid delivers a voltage lower than 60V, in particular around 18 or 12V; a high voltage grid delivers a voltage greater than 60V, especially greater than 100, 200 or even 400V.

Figure 7:
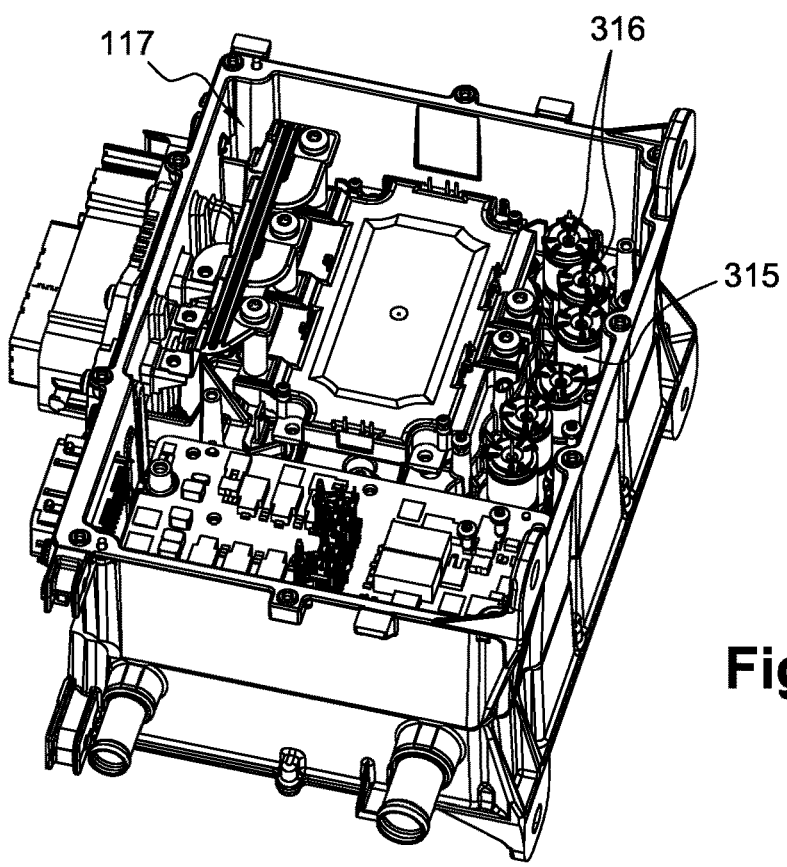
FIGS. 6 and 7 are other views of the first case of the electrical equipment with some components removed.

FIG. 7 shows the integration of an electrical busbar 400 according to the invention within a case 110 of the electrical equipment 1. Some components are not shown for ease of understanding.

Figure 16:
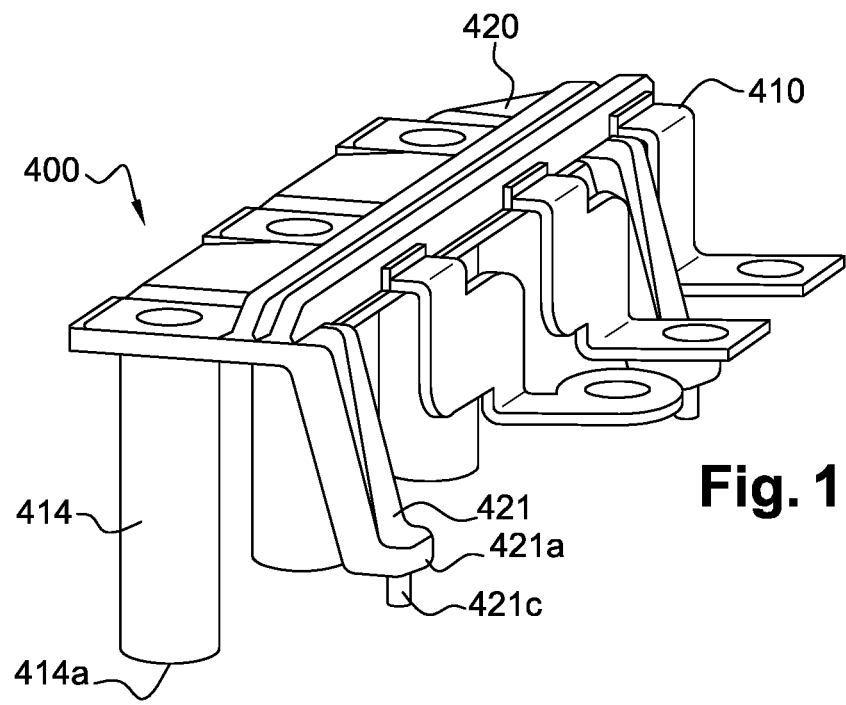
FIGS. 16 and 17 are perspective views of the example of the electrical busbar according to the invention.
Figure 17:
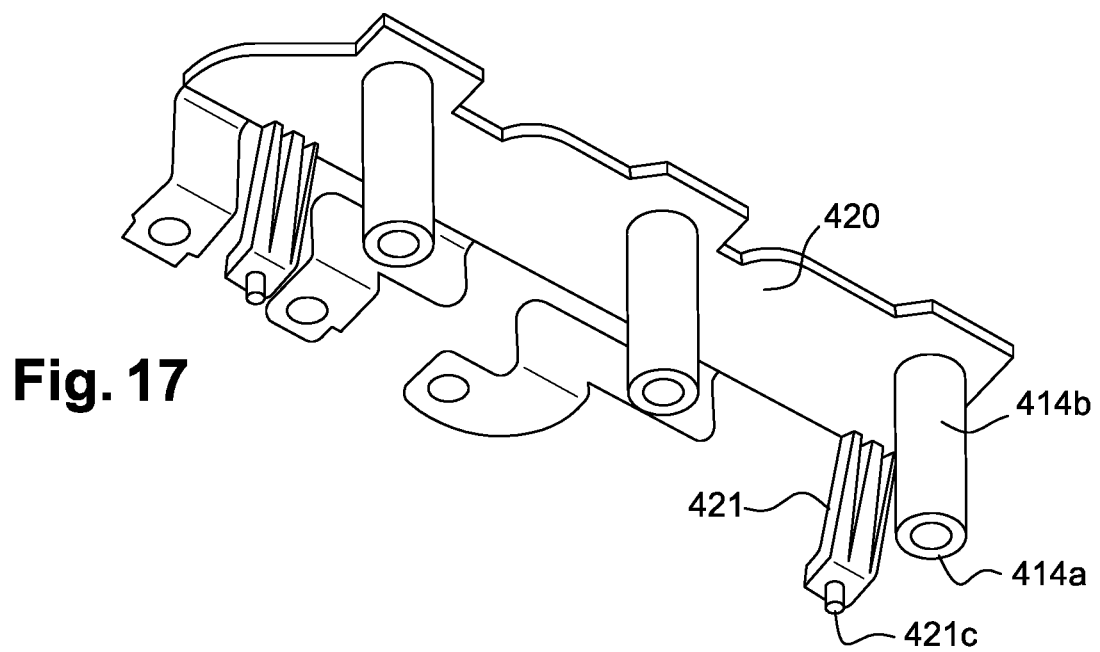
Figure 18:
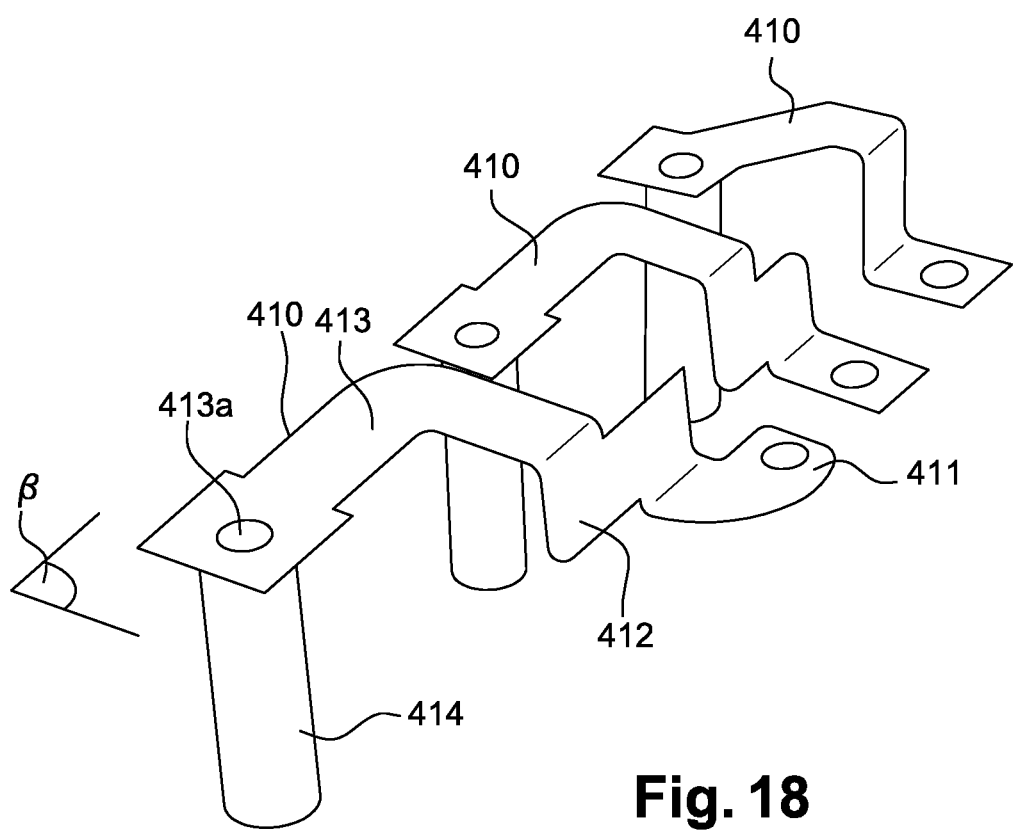
FIG. 18 is a perspective view of the example of electrical busbar according to the invention without its coating.

The busbar 400 provides an electrical connection with a first component 300. In particular, the electrical busbar 400 connects the first component 300 with an electrical connector 382. The electrical connector 382 passes through an opening of the case 110 to allow electrical energy to be exchanged between the first component 300 and the outside of the electrical equipment 1, in particular with the phases of the electrical machine controlled by the inverter. FIGS. 16 to 18 show perspective views of the busbar 400.

The electrical busbar comprises three electrically conductive parts 410. In particular, each electrically conductive part 410 makes it possible to electrically connect a phase of the electrical machine controlled by the inverter with the first component 300. The busbar 400 could comprise a different number of pieces 410, in particular a number depending on the number of phases of the electrical machine controlled by the first component 300. Each conductive part 410 is in particular an integral part. The electrically conductive parts 410 are for example made of copper.

A coating 420 covers the conductive parts 410 with electrically insulating material. In particular, the insulating material is a plastic material overmolded on the conductive parts 410. The coating 420 covers the conductive parts 410 in a plane β in which extends a flat portion 413 of the conductive part 410. A first end 411 of the conductive part 410 forms an electrical connection terminal of the conductive part 410. The first end 411 comes into contact with a terminal 382e of the electrical connector 382. A mechanical contact is for example obtained via a screw, welding or any other means.

In particular, the first end 411 is connected to the flat portion 413 by a middle portion 412, which allows to span a distance between the flat portion 413 and the first end 411.

In particular, the first end 411 is positioned to correspond with a terminal 382e of the electrical connector 382. The middle portion 412 may extend in a transversal direction with respect to the plane β or in a direction parallel to the plane β to allow contact with the terminal 382e of the electrical connector 382.

The first end 411, the middle portion 412 and the flat portion 413 are in particular in one piece. They can be formed from a single blade, notably a metal blade.

The flat portion 413 comprises an opening 413a. A cylinder 414 made of electrically conductive material extends from the opening 413a from a first side of the conductive member 410 towards a transversal direction to the main plane β. The cylinder 414 is for example made of copper. In particular, the cylinder 414 is added to the flat portion 413. The cylinder 414 is notably secured to the flat portion 413 by a laser weld or with an adhesive, for example. The cylinder 414 and the flat portion 413 could be secured in another way, provided there is a functional electrical contact between the busbar 400 and the first component 300. Alternatively, the cylinder 414 and the flat portion 413 could be obtained together by conforming the same material.

The proximal end 414b of the cylinder 414 notably corresponds with the opening 413a of the flat portion 413. In particular, the inner wall of the cylinder 414 at the proximal end fit with the edges of the opening 413a of the flat portion 413. The cylinder 414 is thus hollow and forms among others a barrel in which a rod 500 can be introduced through the opening 413a of the flat portion 413.

When assembled in the electrical equipment 1, the cylinder 414 receives the rod 500 which rest the distal end 414a of the cylinder 414 against an electrical terminal 300e of the first component 300.

The distal end 414a of the cylinder 414 therefore forms an electrical connection terminal of the busbar 400. The cylinder 414a deflects the electrical terminal of the busbar 400 from the main plane β to a distant plane from the main plane β. Thus, the main plane β of the busbar may be at a different level from the plane in which is located the electrical terminal 300e of the first component 300, which improves the integration of the components in the case 110 of the electrical equipment 1. By resting the distal end 414a of the cylinder 414 on the electrical terminal 300e of the first component 300, the rod 500 ensures a good electrical contact between the distal end 414a of the cylinder 414 and the electrical terminal 300e of the first component 300.

In particular, the coating 420 leaves bare a part of the flat portion 413 at the immediate periphery of the opening 413a of the flat portion 413. A second side of the flat portion 413 which is opposite to the first side is therefore without any electrically insulating material around the opening 413a. Thus, a head 500a of the rod 500 can apply a force directly on the surface of the conductive part 410 and not on the coating 420, which improves the resistance in time of the resting of the cylinder 414 on the terminal 300e of the first component 300.

The rod 500 may be made of an electrically conductive material, such as a metal like steel. By coming directly into contact with the surface of the conductive part 410, the head 500a can allow a flow of current via the rod 500 which contributes to the exchange of current between the busbar 400 and the first component 300.

To carry out the resting of the cylinder 414 on the electrical terminal 300e of the first component 300, the rod 500 may comprise a thread which corresponds with a corresponding thread in the inner wall of the cylinder 414 and with a corresponding thread in a hole of the terminal 300e of the first component 300. A washer can be inserted between the head 500a of the rod 500. However, the resting could be obtained in other ways; for example, with a press-fit technique. In addition, by engaging with the electrical terminal 300e of the first component 300, and in particular with the inner wall of the cylinder 414, the rod 500 contributes to the mechanical holding of the busbar in the electrical equipment.

The coating 420 may comprise protrusions 421 which contribute to the mechanical holding of the electrical busbar 400, in particular in the case 110 of the electrical equipment 1. The protrusion 421 extends transversely from the main plane β on the same side as the cylinder 414. In particular, the protrusion 421 forms a tab, the distal end 421a of which rests against a support S. In particular, the support S is a portion of material of the case 110 of the electrical equipment 1. The distal end 421a therefore forms a surface that rests on the support S to contribute to the mechanical holding of the busbar 400 in the case 110. In particular, the protrusion 421 extends from the portion of the coating 420 which is in the main plane, away from the cylinder 414. This improves the stability of the busbar 400 in the electrical equipment.

The distal end 421a of the protrusion 421 may comprise a pin 421c which goes into a hole of the support S for an indexing in position of the busbar 400 during its assemblage in the case 110. In particular, the busbar 400 is introduced in one direction into the case 110 through an opening defined by side walls 116 of the case 110. In particular, the pin 421c cooperates with the hole of the support S to block the busbar 400 in transverse directions with regards to the insertion direction, but not in the insertion direction, so as to ensure that a resting is obtained between the distal end 414a of the cylinder 414 and the terminal 300e of the first component 300.

In particular, the cylinder 414 extends perpendicularly from the main plane β. The direction of the cylinder 414 corresponds in particular to the insertion direction of the electrical busbar 400 in order to be positioned within the electrical equipment 1.

The first component 300 is in particular a power electronic module 300 that is a part of the inverter. In particular, the power electronic module 300 comprises components intended for powering the electrical machine. The electronic module designates a set of components, notably electronic switches, such as semiconductor transistors, which are assembled in a case specific to the module 300 and electrically accessible from outside the case specific to the module 300 by the electrical terminals 300e of the electronic module 300. The switches are in particular arranged in an electrical circuit to allow an operated passage of electrical energy between an electrical power source, comprising the first electrical grid of the vehicle, and an external component, comprising the electrical machine operated by the inverter. This power electronic module 300 can be supported by a first wall 111 of the case 110, which forms in particular a bottom of the case 110.

Figure 5:
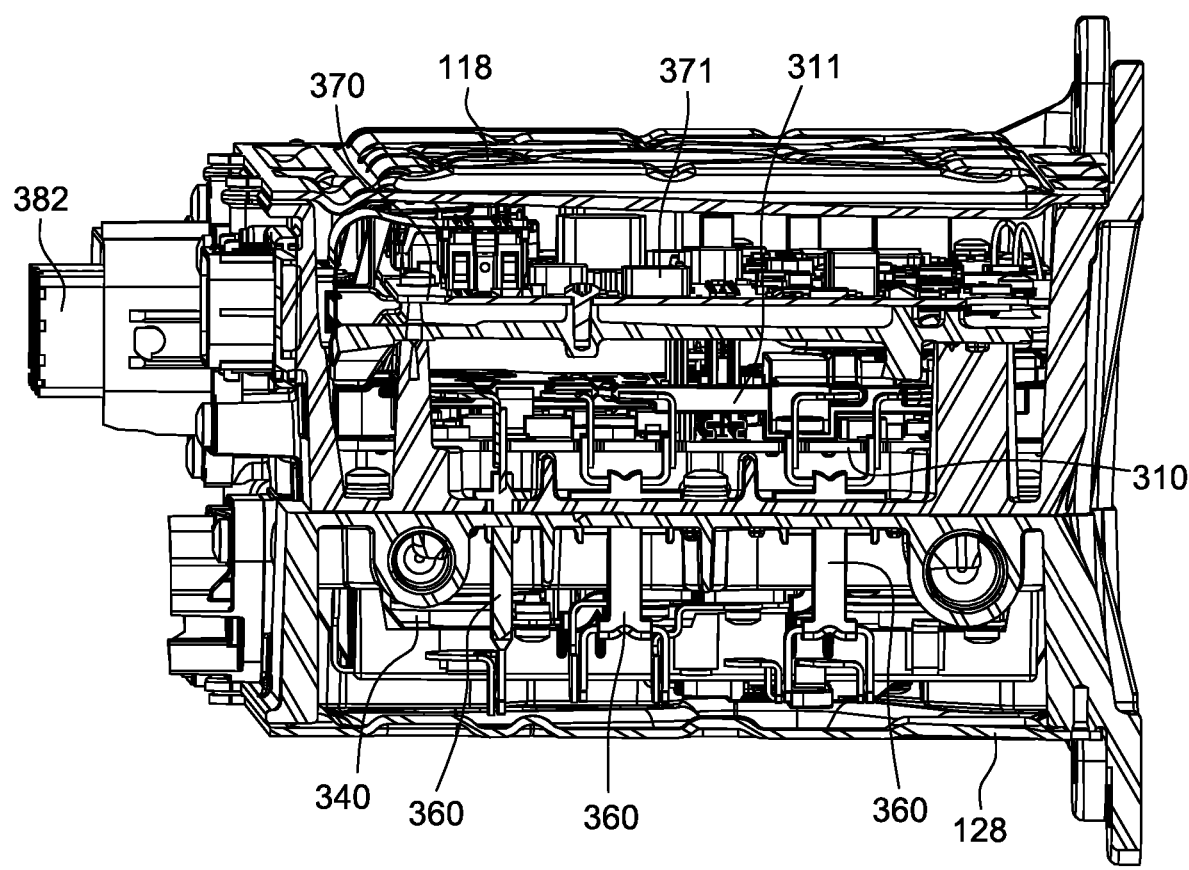
FIG. 5 is a sectional view of the electrical equipment.
Figure 6:
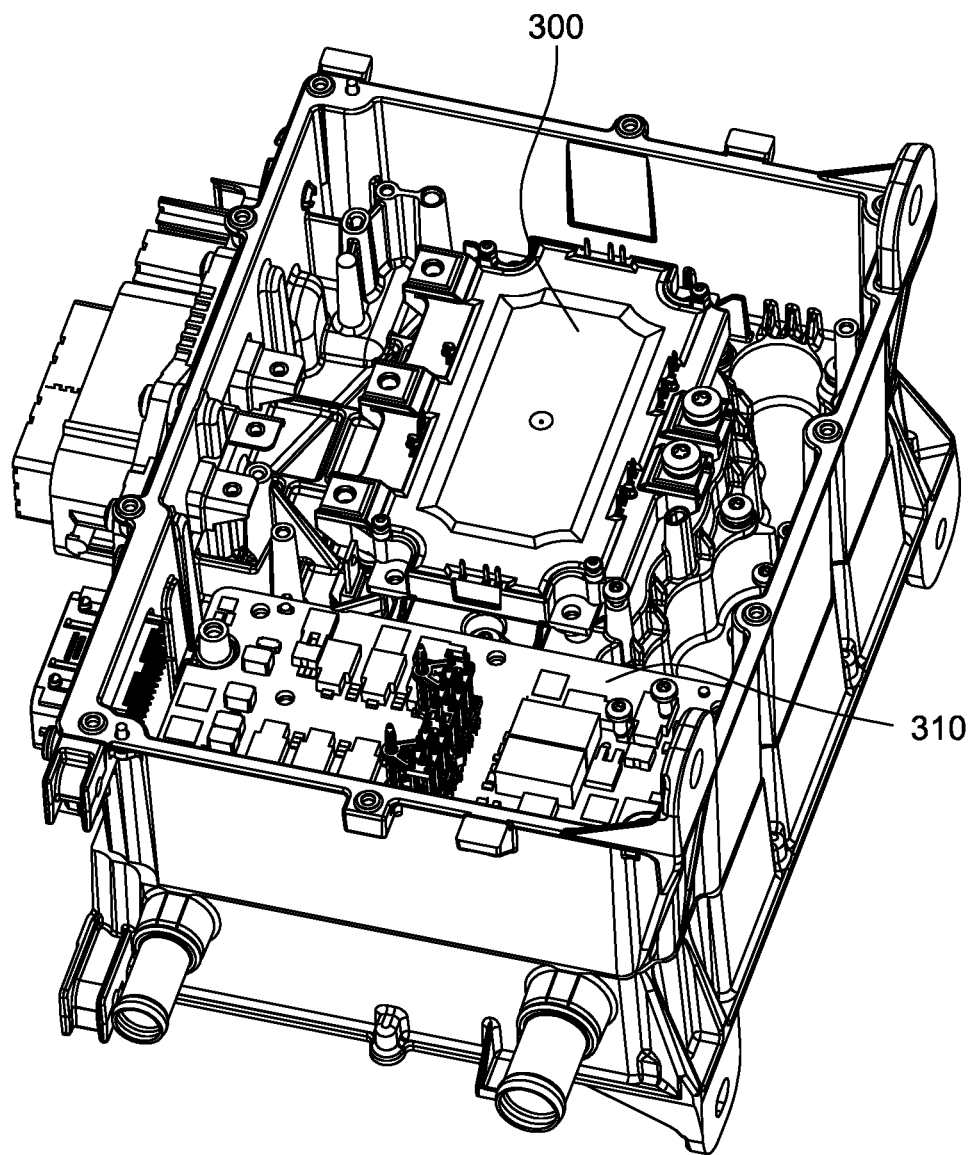
Figure 8:
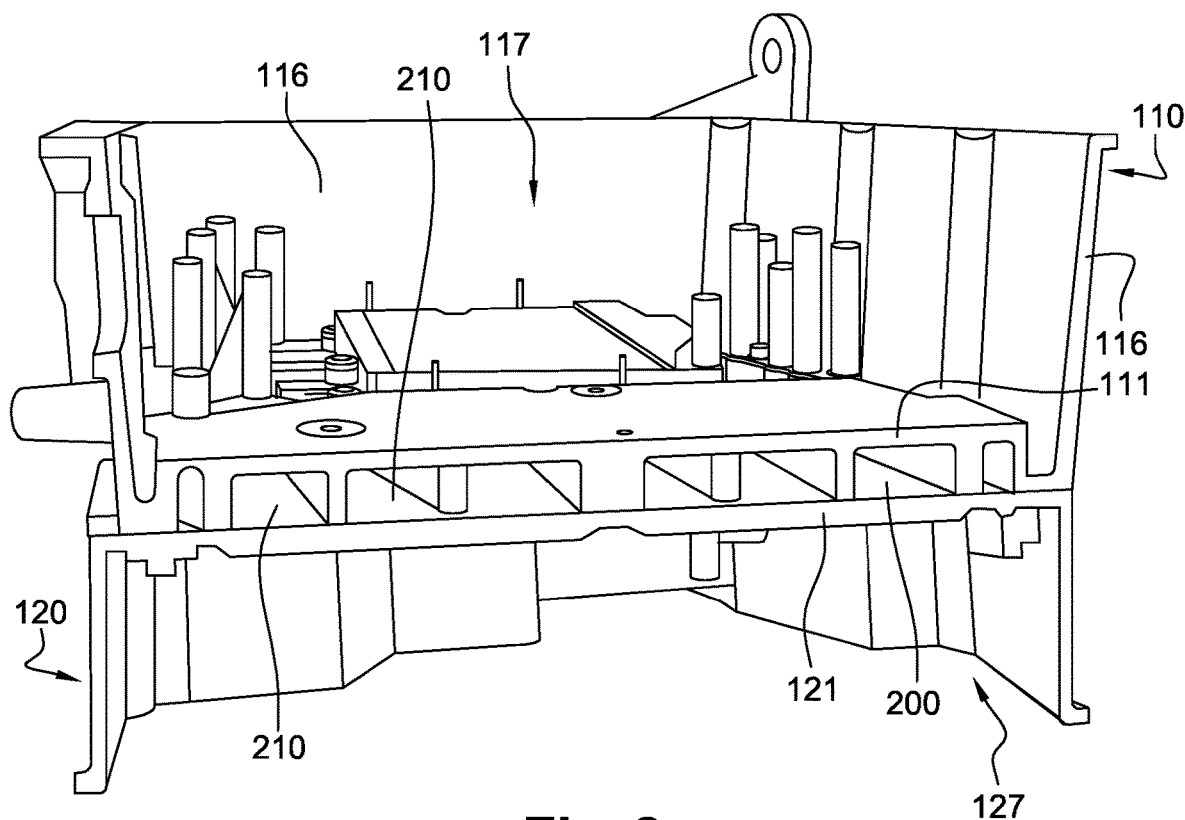
FIGS. 8 and 9 are sectional views of the case assembly of the electrical equipment.
Figure 9:
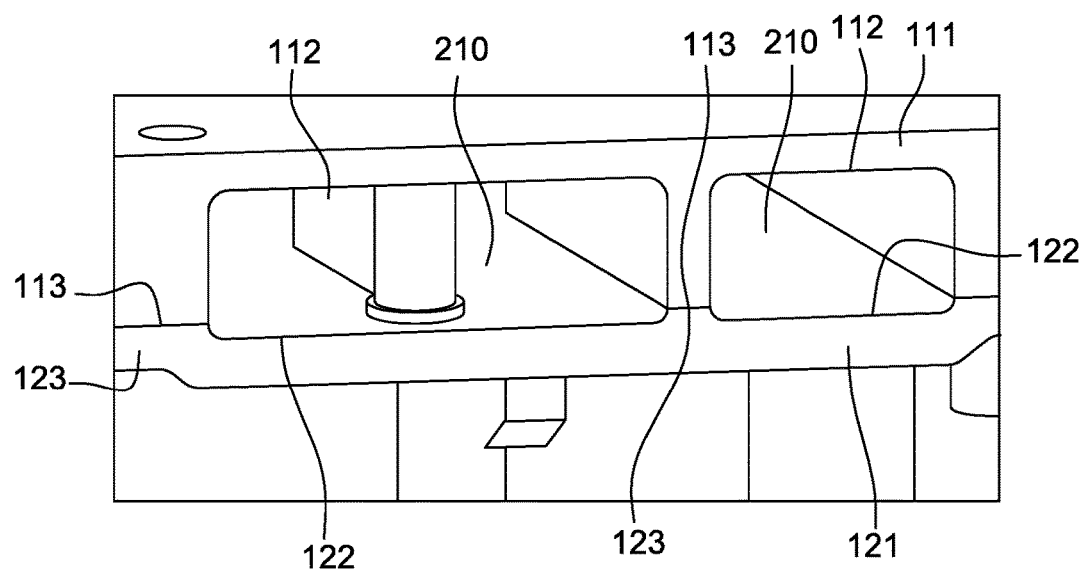
Figure 10:
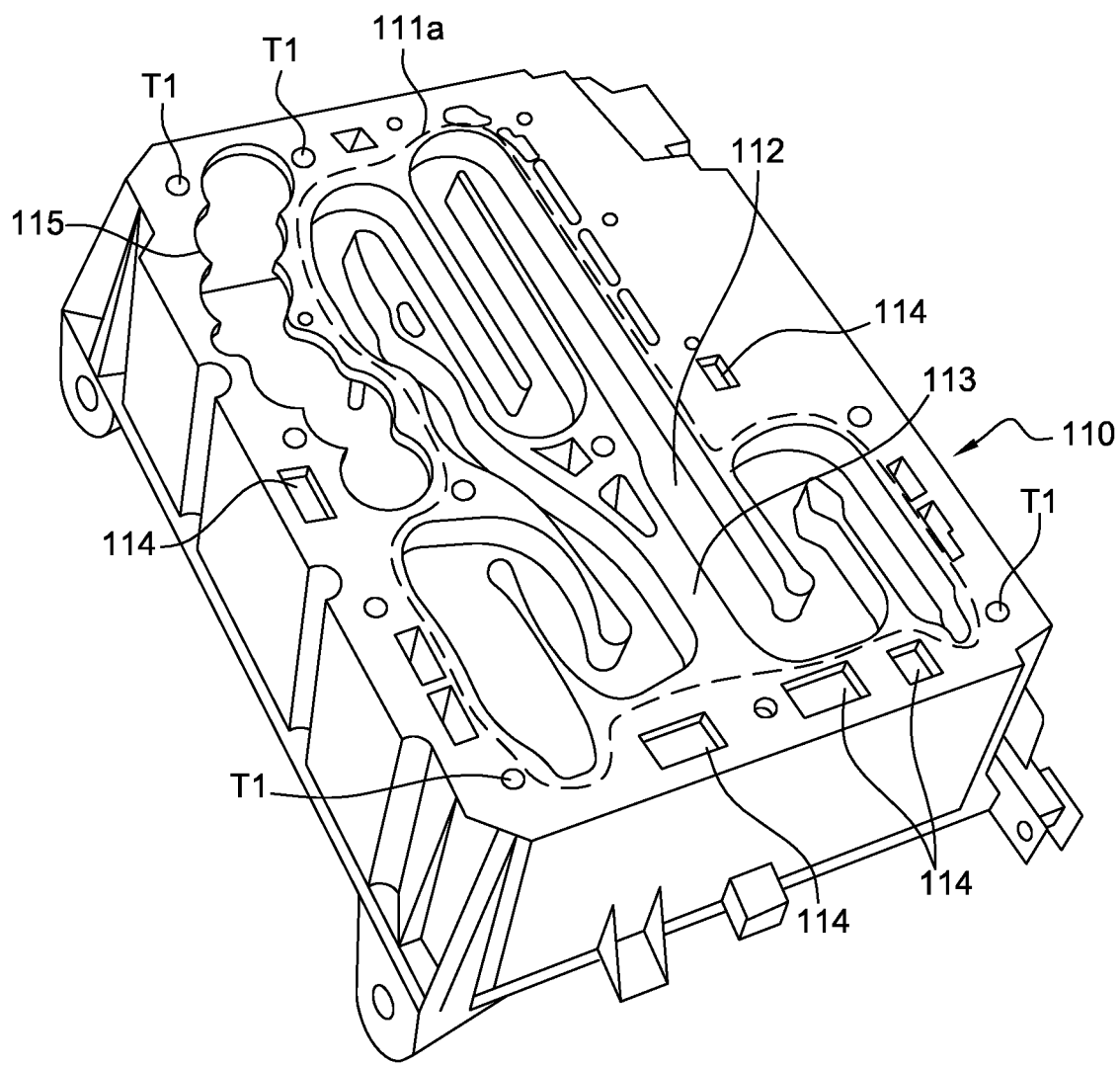
FIGS. 10 and 11 are perspective views of the first case of the assembly.
Figure 11:
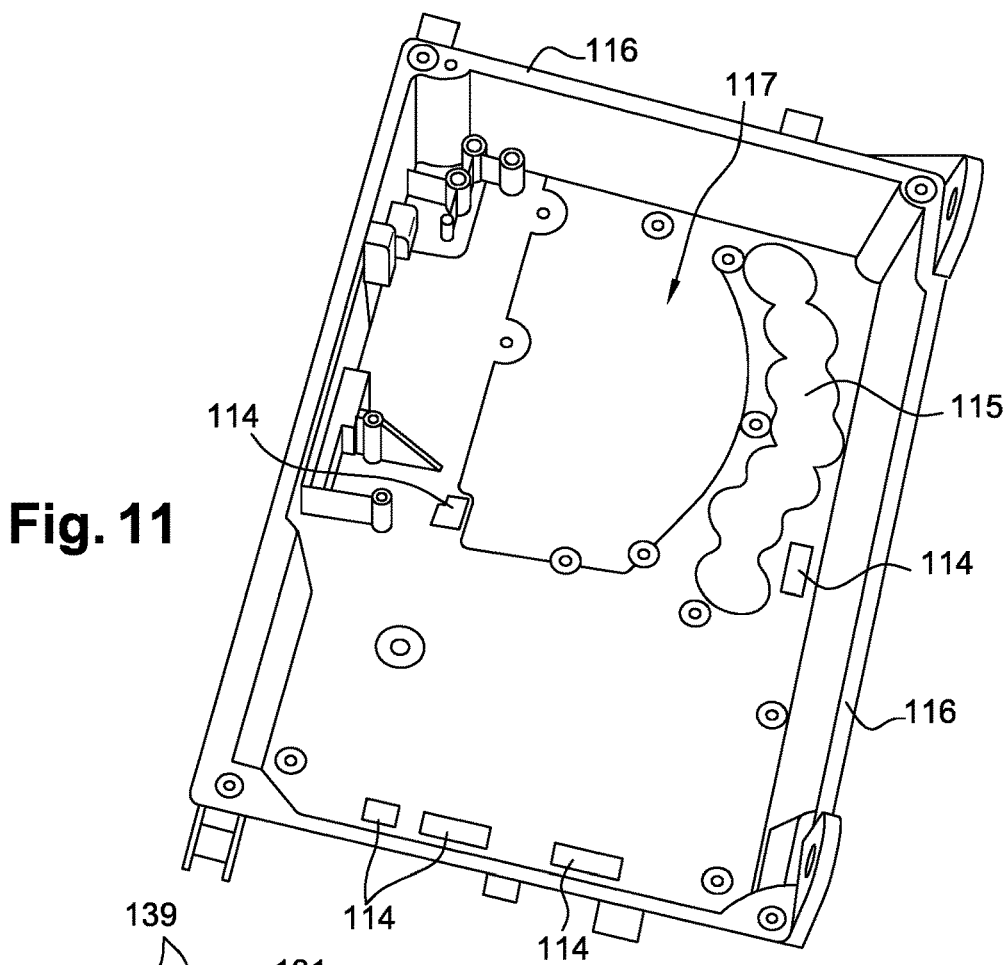
Figure 15:
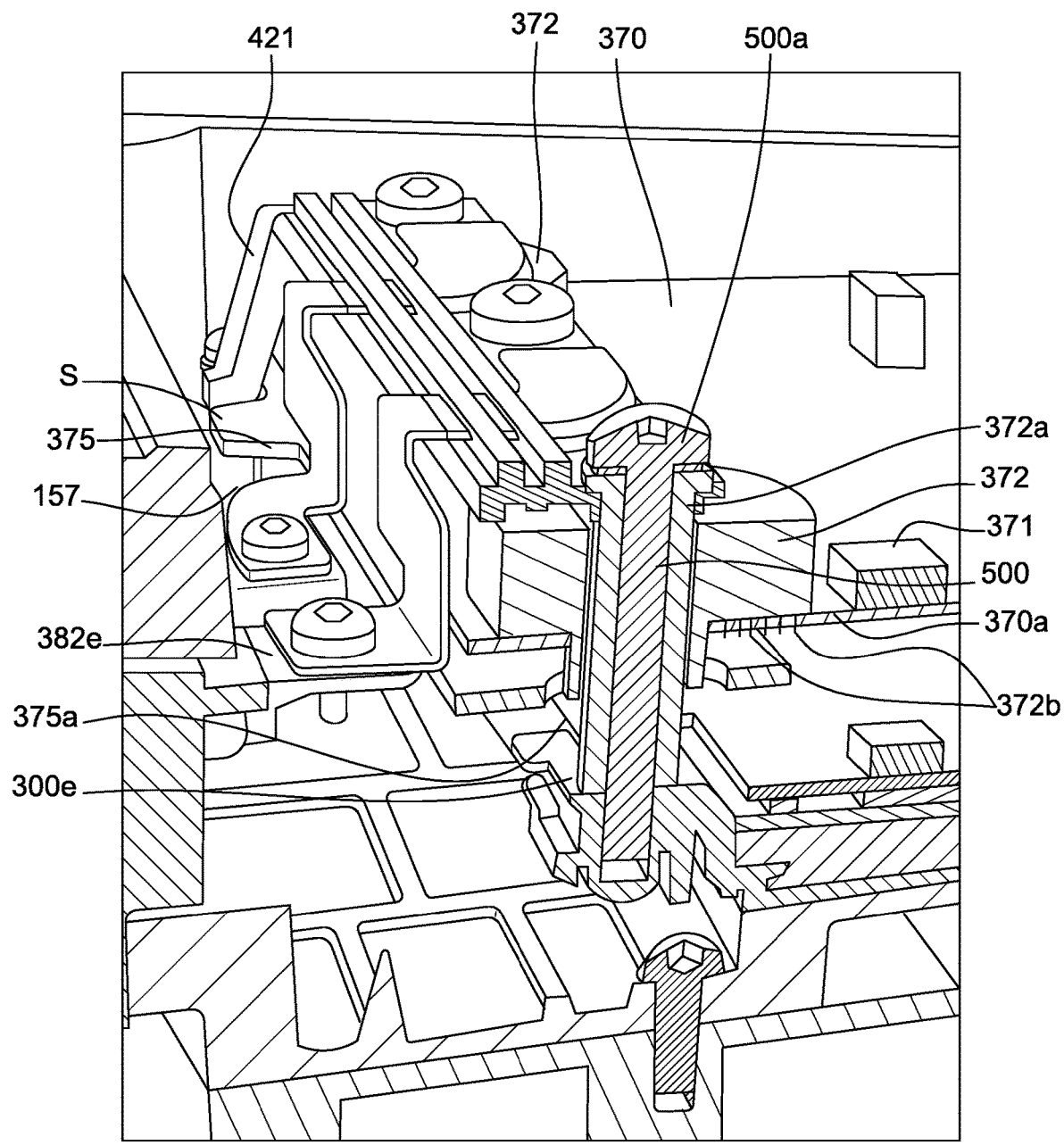
FIG. 15 is a detailed view illustrating an example of an electrical busbar according to the invention when assembled within the first case.

An electronic control unit 370 and a support 375 of the electronic control unit 370 are, for example, housed in the same case 110, as illustrated in FIGS. 5 and 15. The support 375 of the electronic control unit 370 is a wall, in particular a plate, which is suspended in the housing 117 defined by the case 110. For example, the support is brought in the case 110 and held in place by resting against portions of material of the first case 110, comprising protrusions 157 coming from the surface of the case 110. The support 375 is notably held in place by resting at its periphery. The support 375 is for example made of metal to improve the heat dissipation of the electronic control unit 370. The electronic control unit 370 is in particular an electronic card 370 on which components 371 are mounted. The electronic control unit 370 is supported by the support 375 via a side in contact with the support 375. In particular, the electronic control unit 370 operates the components of the inverter and/or the DC/DC converter, in particular the switches of the power electronic module 300. To this end, the electronic unit 370 can exchange a data signal with the outside of the electrical equipment, for example with a controller of the vehicle.

In particular, the power module 300, the support 375 of the electronic control unit 370 and the electronic control unit 370 are superimposed in a facing arrangement into the first housing 117 defined by the first case 110. The support 375 of the electronic control unit is located between the power module 300 and the electronic control unit 370.

When the busbar 400 is mounted in the electrical equipment 1, the cylinder 414 goes through the electronic control unit 370 through an opening 370a and goes through the support 375 of the electronic control unit 370 through an opening 375a in order to come into contact with the electrical terminal 300e of the power electronic module 300. This arrangement allows to save some space in the housing 117 and therefore improves the integration of the components in the housing 117 defined by the case 110.

In addition, the electronic control unit 370 may comprise current sensors 372 in order to measure the currents flowing through the busbar 400. The current sensors 372 are in particular mounted on the surface of the electronic card forming the electronic control unit 370. In particular, the electronic control unit 370 comprises a respective current sensor 372 for two of the conductive parts 410 and not for the third conductive part 410. The current flowing through the third conductive part 410 can be deduced from the currents measured on the other two conductive parts. Each current sensor 372 has an opening 372a traversed by the cylinder 414. In particular, the current sensor 372 measures the current from a magnetic field induced by the passage of the current. The current sensors 372 are, for example, Hall effect sensors. Each current sensor 372 may comprise spindles 372b which are received in the electronic card forming the electronic control unit 370 for conveying the value of the measured current.

The case 110, hereinafter referred to as the first case 110, can be associated with a second case 120 to form an assembly 100 forming a case of the electrical equipment 1.

Figure 4:
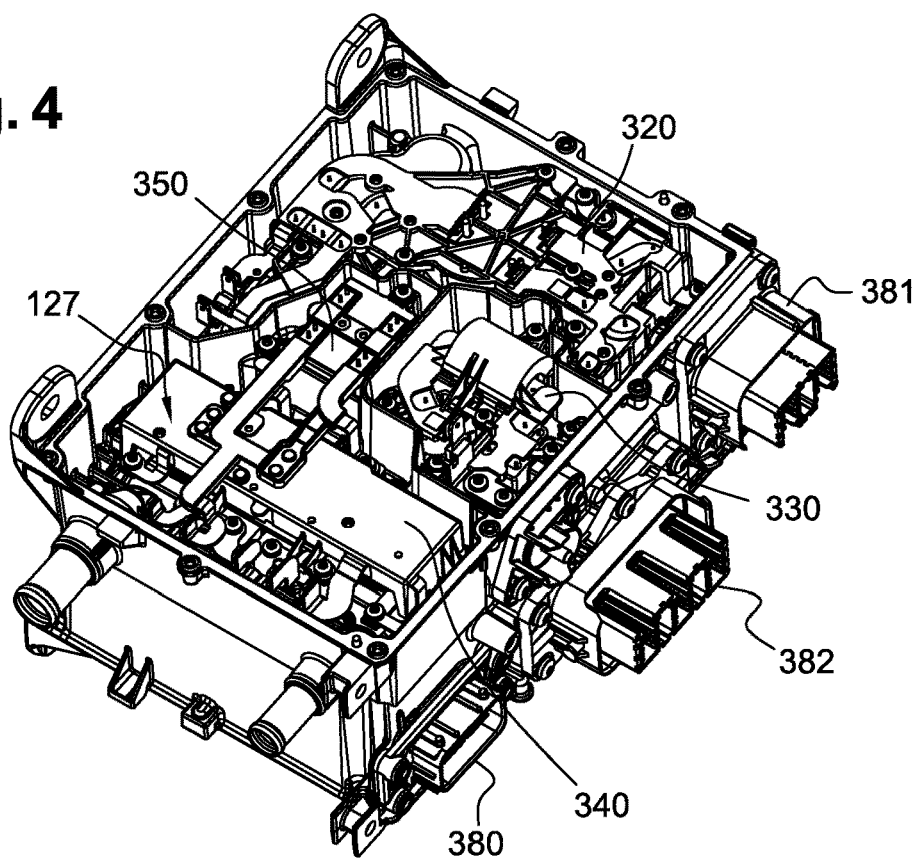

In addition to the power electronic module 300, the electronic control unit 370 and the support 375 of the electronic control unit, the first case 110 can receive other first components, illustrated for example in FIGS. 3 and 5 to 7. The second case 120 receives one or more second electrical components, illustrated for example in FIGS. 4 and 5.

Examples of the first 110 and second 120 cases are illustrated in FIGS. 8 to 14. The first case 110 may comprise a first wall 111 which rest on a second wall 121 of the second case 120 to form a cooling circuit 200 of the electrical equipment 1. To this end, the first wall 111 may comprise a groove 112 which faces a groove 122 of the second wall 120 to form the cooling circuit 200. The cooling circuit 200 receives a fluid intended for cooling the electrical equipment 1.

In particular, the first groove 112 and the second groove 122 come face to face to form a channel 210 of the cooling circuit in which the cooling fluid will flow. Thus, the diameter of the cooling channel is distributed between the two walls.

In particular, the first wall 111 and the second wall 121 come against each other at respective substantially flat surfaces 113, 123, so-called resting surfaces. The resting surface 113 of the first wall 111 comprises the edges of the first groove 112; and the resting surface 123 of the second wall 121 comprises the edges of the second groove 122. The term "edge" of the first 112 or second groove 122 should be considered as the boundary between the groove 112, 122 and the surface from which the groove 112, 122 becomes hollow. The surface from which the first groove 112 becomes hollow corresponds in particular to the resting surface 113 of the first wall 111; and the surface from which the second groove 122 becomes hollow corresponds in particular to the resting surface 123 of the second wall 121. In particular, the edges of the first 112 or second 122 grooves are integrally comprised in their respective resting surface 113, 123.

By providing flat resting surfaces between the first 111 and the second wall 121, the implementation of the sealing of the cooling circuit 200 is eased. Indeed, the portions of the first wall 111 and the second wall 121 that come against each other to form the cooling circuit 200 are preferably machined to remove surface irregularities that could create leaking areas of the coolant, out of the cooling circuit 200. By providing flat contact surfaces 113, 123, the machining of these resting surfaces 113, 123 is eased.

The first wall 111 may comprise at least one through hole 114 and the second wall 121 may comprise at least one through-hole 124, the edges of which contact one another to form a passage between the side of the first wall 111 which is opposed to the side carrying the first groove 112 and the side of the second wall 121 which is opposite to the side carrying the second groove 122. In particular, these through holes 114, 124 form a passage between the first housing 117 defined by the first case 110 and a second housing 127 defined by the second case 120. These through holes 114, 124, are especially formed outside the zones 111a, 121a of the first 111 and second 121 walls which form the cooling circuit 200.

Figure 12:
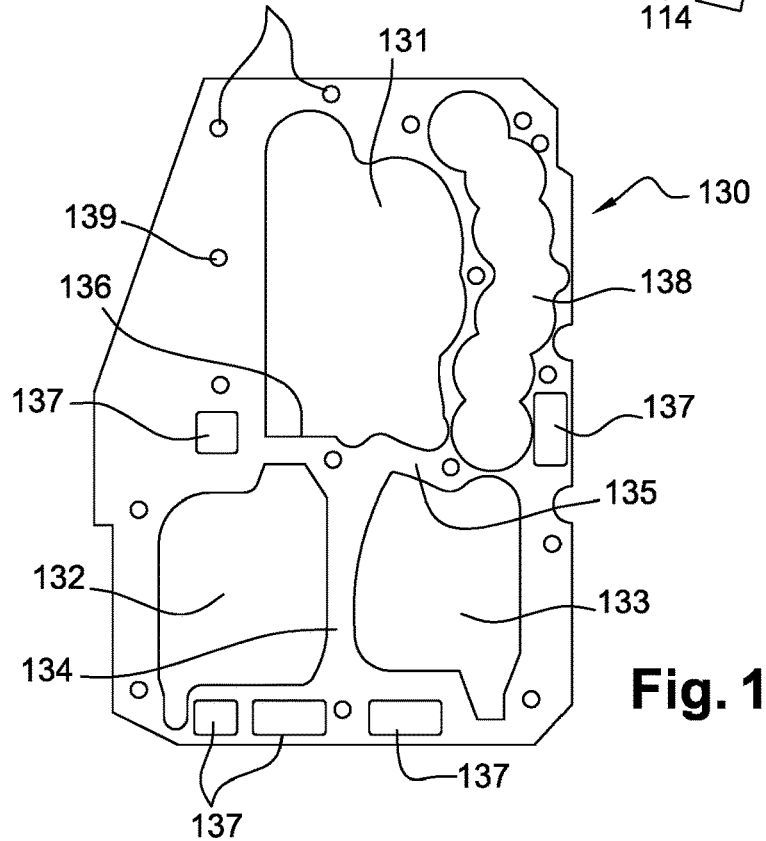
FIG. 12 shows a seal inserted between the first and the second case of the assembly.
Figure 13:
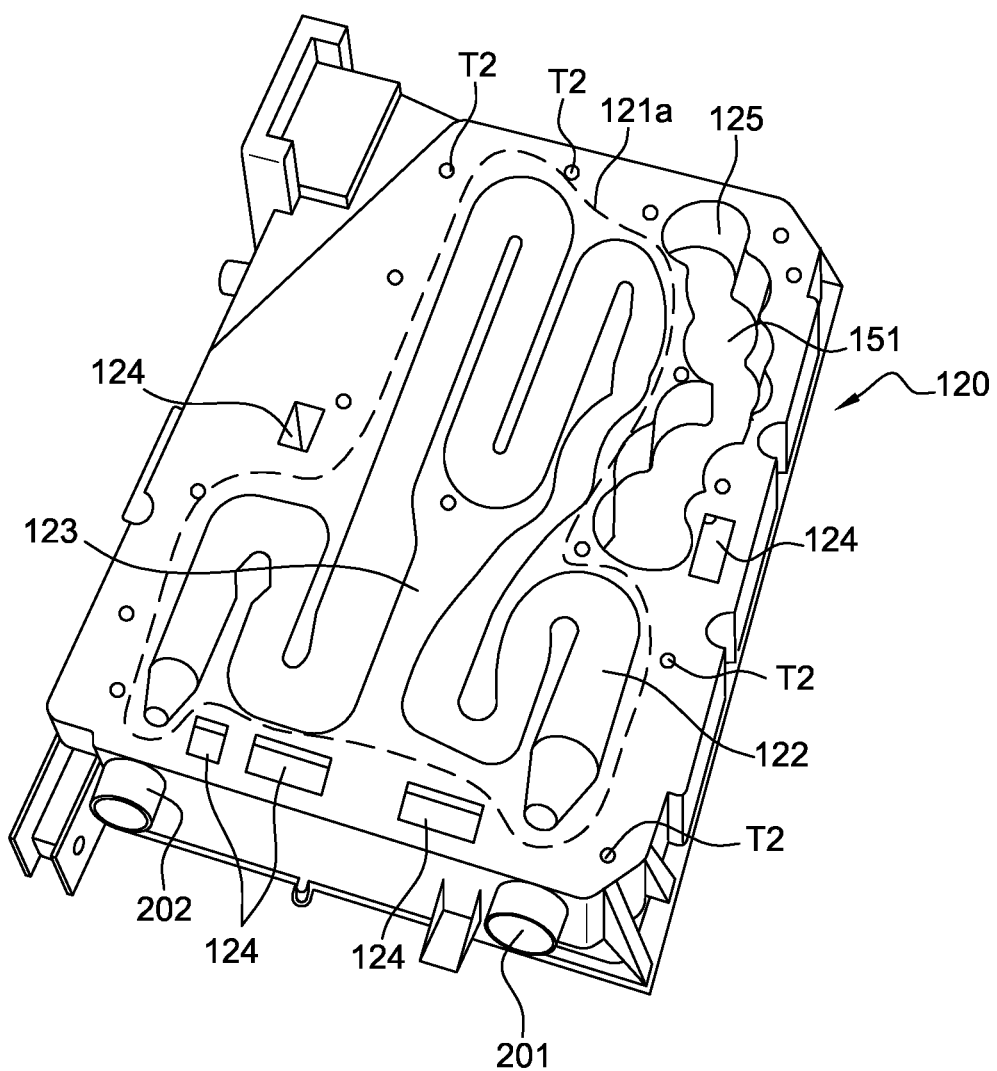
FIGS. 13 and 14 are perspective views of the second case of the assembly.
Figure 14:
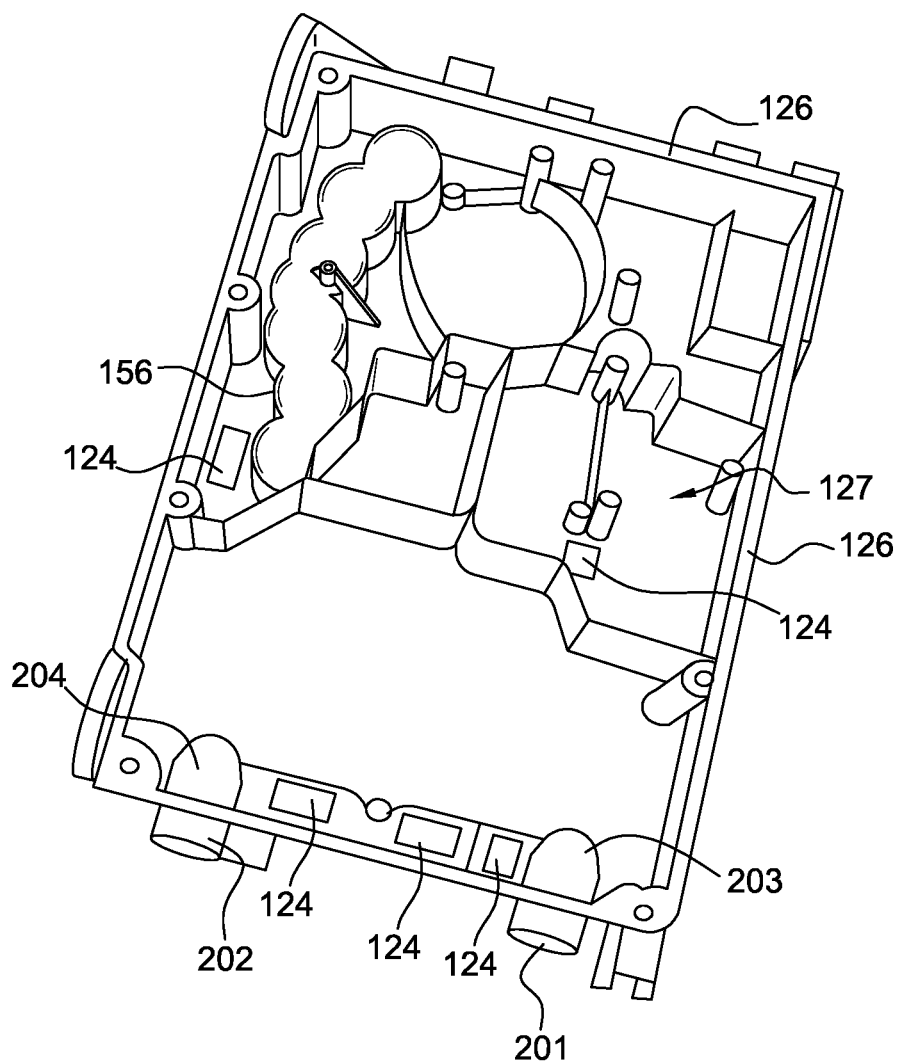

A seal may be positioned between the first wall 111 and the second wall 121. An example of a seal 130 is illustrated in FIG. 12. In particular, the seal 130 provides a tightness around the zones 111a, 121a of the first 111 and second 121 walls which form the cooling circuit 200. To this end, the seal 130 comes in particular between the resting surfaces 113, 123 of the first wall 111 and the second wall 121. The seal 130 may be empty of any material in a portion that is located within the cooling circuit 200 when formed, except for material strips 134, 135, 136. These material strips 134, 135, 136 improve the rigidity of the seal 130 so as to facilitate the handling and placement of the seal 130. These material strips 134, 135, 136 may have widths just sufficient to obtain rigidity and define openings 131, 132, 133. The seal 130 seals along a closed line around the cooling circuit 200, especially around the areas 111a, 121a of the walls 111, 121 which form the cooling circuit 200. The seal 130 may also seal around the passages formed in the first wall 111 and the second wall 121. The seal 130 thus comprises holes 137 whose edges provide sealing around said passages. The seal 130 may also comprise holes 139 which allow the passage of respective fixing members intended for fixing the first wall 111 on the second wall 121.

The cooling circuit 200 may comprise an input port 201 and an output port 202 through which the coolant enters and exits the cooling circuit 200. The input 201 and output 202 ports are comprised in the second case 120, notably in a side wall 126 of the second case 120 described below. In particular, the input/output ports 201, 202 are tubular openings in the side wall 116. These input/output ports 201, 202 are extended by tubes 203, 204 which communicate with the second groove 122 of the second wall 121 for conveying or extracting the coolant therein. End pieces 205, 206 may be inserted into the input/output ports 201, 202 to fit them to a coolant supply circuit.

Each case 110, 120 may comprise respective side walls 116, 126 extending transversely from the periphery of the first 111 or second wall 121 to define a respective first housing 117 and second housing 127. In particular, when the first 110 and second cases 120 are mounted on each other so as to form the cooling circuit 200, the side walls 116 of the first case 110 extend in a direction opposite to the second case 120 and the side walls 126 of the second case 120 extend in a direction opposite to the first case 110. Each housing 117, 127 can be closed by a respective cover 118, 128 which comes against the distal ends of said side walls 116, 126. Thus, the first wall 111 forms a bottom of the first case 110 and the second wall 121 forms a bottom of the second case 120.

In particular, the first case 110 and the second case 120 are fastened to one another by fixing members which hold the first wall 111 against the second wall 121. These fixing members are for example screws which are introduced into corresponding holes T1, T2 in the first wall 111 and the second wall 121. The fixing members may also be clips, for example carried by the side walls 116, 126 of the first case 110 and the second case 120.

The first housing 117 defined by the first case 110 may comprise an electronic board 310 with an insulated molded substrate (SMI), which is part of the DC/DC converter. The SMI board carries components for the voltage conversion between the first and the second electrical grid of the vehicle. The SMI card 310 may be supported by the first wall 111 of the first case 110, with one of its sides coming into contact with the first wall 111. The SMI board comprises, for example, electronic switches, such as semiconductor transistors, or others.

The second housing 127 defined by the second case 120 can receive an electromagnetic compatibility (EMC) filter 320 for filtering an input signal of the electrical equipment 1, and/or an EMC filter 330 for filtering an output signal of the electrical equipment 1, and/or a magnetic component 340 comprising an inductance for rectifying a current delivered to the power module 300 and a transformer for the DC/DC converter of the electrical equipment 1 and/or a capacitive module 350 for enabling zero-voltage switching (or ZVS) of the electrical switches comprised in the electronic module 300 and/or on the SMI card 310. These second components 320, 330, 340, 350 may be supported by the second wall 121, with one of their sides coming into contact with the second wall 121.

The first wall 111 may comprise a through opening 115 whose edges fit with an opening 125 of the second wall 120. A protrusion 156 extends from the edges of the opening 125 on the side of the wall 121 which is opposite to the side of the wall 121 which carries the second groove 122. The protrusion forms a cavity 151 which receives a capacitive block 315, as viewed in FIG. 7. Capacitive block 315 comprises a plurality of capacitors 316. It is connected to the inverter, in particular to the power electronic module 300, and to the DC/DC converter, notably to the SMI card 310. In particular, the capacitive block 315 is in the electrical connection between the first electrical grid of the vehicle and the power electronic module 300 and the SMI card 310; and constitutes a power reserve as close as possible to the power electronic module 300 and the SMI card 310, in particular for a cutting by their switches. To this end, the capacitive block 315 is connected to the power module 300 and the SMI card by an electrical busbar (not shown). The through opening 115 of the first wall 111 is outside the zone 111a of the first wall 111 which is intended to form the cooling circuit 200. The opening 125 of the second wall 121 is outside the zone 121a of the second wall 121 which is intended to form the cooling circuit 200. The seal comprises a hole 138 to allow the passage of the capacitive block 315.

The components housed in the first housing 117 may be electrically connected with the second components 320, 330, 340, 350 by means of the passages defined by the through holes 114, 124 formed in the first 111 and the second wall 121. FIG. 5 illustrates an example of an electrical connection between an electrical connector 311 of the SMI board 310 and a terminal of the magnetic component 340 by means of an electrical connector 360.

In particular, the electronic switches of the inverter and of the DC/DC converter of the electrical equipment 1, notably the power electronic module 300 and the SMI card 310, are housed in one of the two cases 110, 120 whereas the filtering and rectifying components 320, 330, 340, 350 of the electrical equipment 1 are housed in the other of the two cases. This makes it possible to share the filtering components between the inverter and the DC/DC converter. Furthermore, by housing the switches, in particular the power electronic module 300 and the SMI card 310, in the same case, it is easier to operate them with a single electronic control unit 370. Such an electronic control unit 370 is for example housed in the same case as the switches, as illustrated in FIG. 5.

In addition to the electrical connector 382 providing in particular the electrical connection between the power electronic module 300 and the phases of the electric machine, the electrical equipment 1 may comprise a signal connector 380 intended to allow a data signal exchange between the components of the electrical equipment 1 and the outside of the electrical equipment, for example with a vehicle controller. In particular, the signal connector 380 is connected to the electronic control unit 370. The electrical equipment 1 may comprise a power input connector 381 which allows the power supply of the components of the electrical equipment 1. In particular, the power input connector 381 allows an electrical connection with the first electrical grid of the vehicle, notably with an electrical storage unit of this first electrical grid, to provide an electrical energy input to the inverter and/or the DC/DC converter of the electrical equipment 1. An DC/DC output electrical connector 383 can be used to transfer electrical energy between the DC/DC converter of the electrical equipment 1 and the second electrical grid of the vehicle, in particular with an electrical storage unit of the second electrical grid. These electrical connectors 380, 381, 382, 383 are in particular on one side of the assembly 100 forming the case of the electrical equipment 1 illustrated in FIG. 2. In particular, these electrical connectors 380, 381, 382, 383 are located on the side walls 116, 126 of the first 110 and second 120 cases.

The electrical equipment 1 may comprise a vent 385 for controlling the humidity inside the electrical equipment 1. The vent 385 is in particular carried on one side of the assembly 100 forming the case of the electrical equipment 1. For example, it is carried on a side wall 116 of the first case 110. It could also be carried on a side wall 126 of the second case 126.

The invention is not limited to the single example described above. The figures represent a particular example of implementation which combines several embodiments. However, the features of the embodiments may be independent of each other from one embodiment to another, or combined with one another, as it is apparent from the claims.

In particular, the electrical busbar 410 has been described with three electrically conductive pieces 410 but could comprise a number other than three. The electrical busbar could provide the electrical connection with a component other than the power module 300. The electrical equipment 1 could do without the support plate 375 of the electronic control unit 370. The electronic control unit could then be supported by the case 110, notably by surfaces coming from the case 110.

The invention claimed is:

1. An electrical busbar intended to electrically connect an electrical component, said electrical busbar comprising:
   at least one electrically conductive part,
   a coating made of electrically insulating material covering said part at least in a main plane of the busbar,
   the electrically conductive part comprising:
   a first end forming an electrical connection terminal,
   a planar portion extending so as to follow said main plane, and
   an electrically conductive cylinder which extends from a first side of the planar portion in a transverse direction relative to the main plane, the inner wall of the cylinder extending from an opening located in the planar portion so as to receive a rod in order to bear the distal end of the cylinder on a terminal of the electrical component, the coating comprising at least one protrusion extending transversely from the main plane on the same side as the electrically conductive cylinder, its distal end being configured to form a resting surface of the electrical busbar against a support.

2. The electrical busbar according to claim 1, wherein the electrically conductive cylinder extends perpendicularly from the main plane and the protrusion extends at an angle greater than 90° with respect to the portion of the busbar extending in the main plane.

3. The electrical busbar according to claim 1, wherein the flat portion of the electrically conductive part comprises a second opposite side to its first side and without electrically insulating material around the opening.

4. The electrical busbar according to claim 1, comprising a plurality of said electrically conductive part, in particular three.

5. The electrical equipment according to claim 4, comprising a busbar wherein the coating comprises at least one protrusion extending transversely from the main plane on the same side as the electrically conductive cylinder, its distal end being configured to form a resting surface of the electrical busbar against a support, and wherein the distal end of the protrusion of the coating rests on a surface coming from the case.

6. An electrical equipment intended to be embedded in a vehicle, comprising:
   a case,
   at least a first electrical component housed in said case,
   an electrical connector passing through an opening of the case so as to allow an exchange of energy between the first component and a component external to the electrical equipment,
   an electrical busbar according to claim 1 wherein the first end is connected to a terminal of the electrical connector, said busbar being positioned in such a way that the distal end of the electrically conductive cylinder is in contact with an electrical terminal of the first component, a rod received in the barrel of the electrically conductive cylinder so that the distal end of the electrically conductive cylinder rest on the electrical terminal of the first electrical component.

7. The electrical equipment according to claim 6, wherein the first electrical component is a power electronic module comprising switches intended for receiving a current exchanged with an electrical machine; the electrical equipment also comprising an electronic control unit comprising components intended to monitor the components of the electrical equipment; the electronic unit of control and the power electronic module being superimposed;

and wherein the electrically conductive cylinder passes through the electronic control unit via an opening to contact the electrical terminal of the power module.

8. The electrical equipment according to claim 7, wherein the power electronic module is positioned on a wall of the case, the electronic control unit is supported by a wall located between the electronic control unit and the electronic power module, said wall having a hole intended for the passage of the electrically conductive cylinder.

9. The electrical equipment according to claim 6, wherein the electronic control unit comprises a current sensor configured to measure a current flowing by means of the busbar, said current sensor comprising an opening surrounding the electrically conductive cylinder so as to measure said current, in particular by measuring a magnetic field induced by the passage of current.

\* \* \* \* \*